(12) United States Patent
Melanson

(10) Patent No.: US 6,738,003 B2
(45) Date of Patent: May 18, 2004

(54) DELTA-SIGMA MODULATION CIRCUITS AND METHODS UTILIZING MULTIPLE NOISE ATTENUATION BANDS AND DATA CONVERTERS USING THE SAME

(75) Inventor: John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 13 days.

(21) Appl. No.: 10/191,016

(22) Filed: Jul. 8, 2002

(65) Prior Publication Data

US 2004/0004565 A1 Jan. 8, 2004

(51) Int. Cl.[7] .............................................. H03M 3/00
(52) U.S. Cl. ........................................ 341/143; 341/144
(58) Field of Search .................................. 341/143, 155, 341/144; 333/166, 165

(56) References Cited

U.S. PATENT DOCUMENTS

| | | | | | |
|---|---|---|---|---|---|
| 5,392,042 | A | * | 2/1995 | Pellon | 341/143 |
| 6,414,566 | B1 | * | 7/2002 | Atokawa | 333/134 |
| 6,472,953 | B1 | * | 10/2002 | Sakuragawa et al. | 333/133 |
| 6,483,399 | B1 | * | 11/2002 | Atokawa | 333/133 |
| 6,542,914 | B1 | * | 4/2003 | Pupalaikis | 708/300 |

\* cited by examiner

*Primary Examiner*—Peguy JeanPierre
(74) *Attorney, Agent, or Firm*—James J. Murphy, Esq.; Winstead, Sechrest & Minick

(57) ABSTRACT

A noise shaper including a filter system for generating a first set of poles and zeros characterizing noise attenuation in a signal baseband of a noise transfer function and at least one additional set of at least one pole and one zero characterizing noise attenuation in at least one additional band outside the baseband of the noise transfer function.

29 Claims, 11 Drawing Sheets

Fig. 3C
Fig. 3B
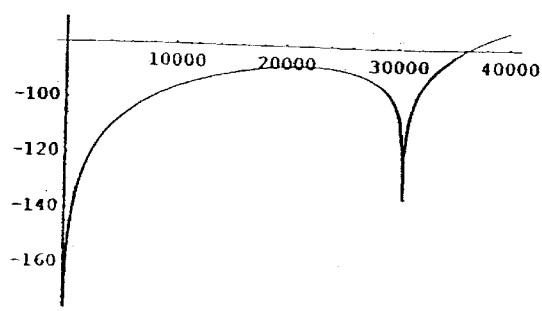
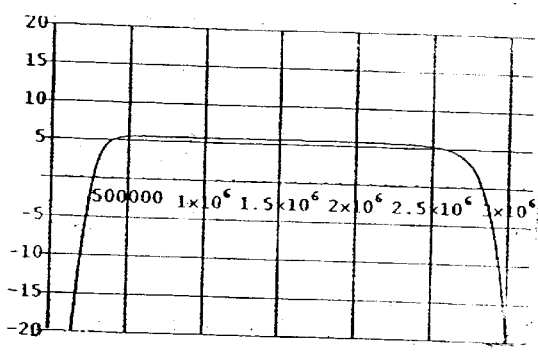
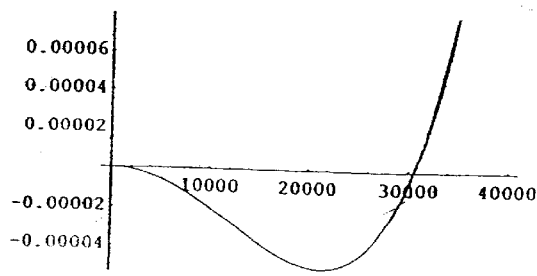
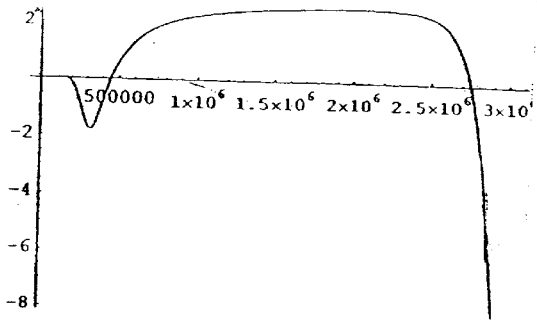
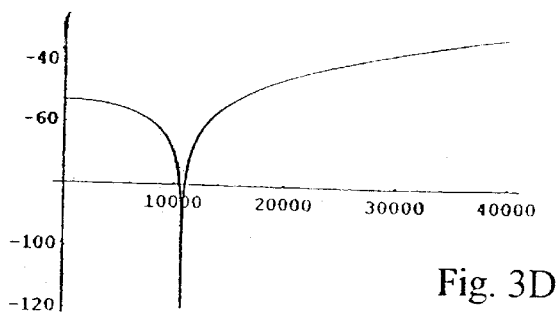
Fig. 3D

Fig. 4C
Fig. 4B
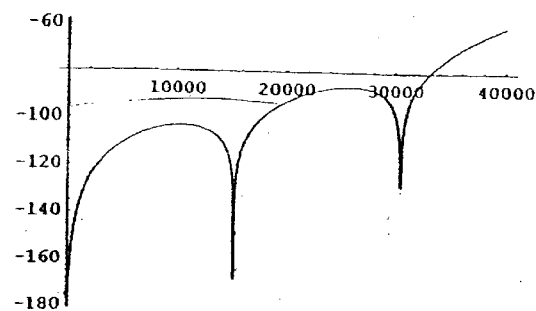
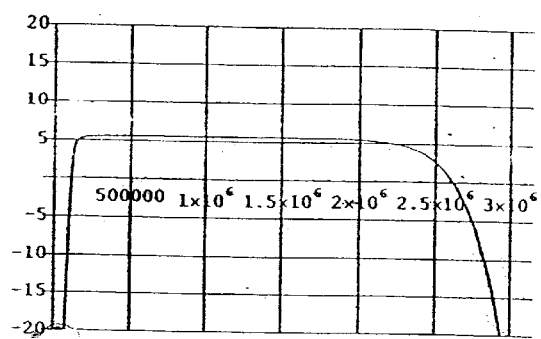
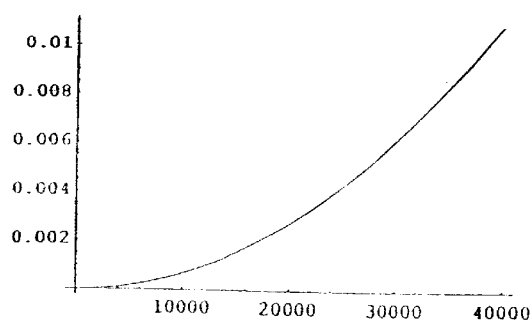
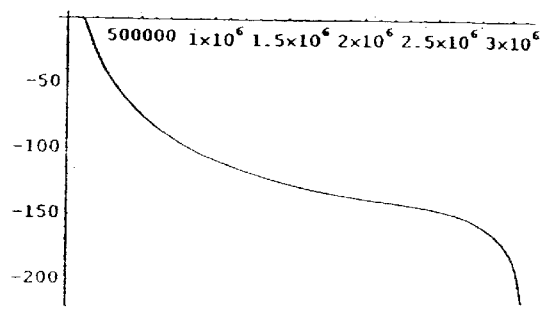
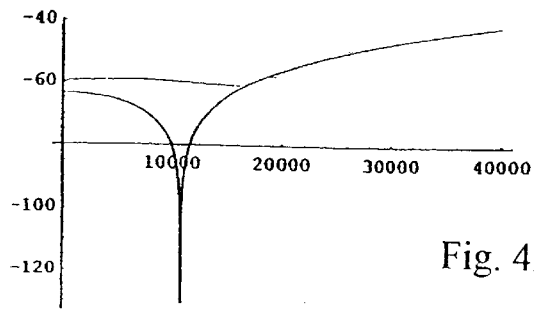
Fig. 4D

DELTA-SIGMA MODULATION CIRCUITS AND METHODS UTILIZING MULTIPLE NOISE ATTENUATION BANDS AND DATA CONVERTERS USING THE SAME

BACKGROUND OF THE INVENTION

1. Field of the Invention

The present invention relates in general to delta sigma modulators and in particular, to delta-sigma modulation circuits and methods utilizing multiple noise attenuation bands and data converters using the same.

2. Background of the Invention

Delta-sigma modulators are particularly useful in digital to analog and analog to digital converters (DACs and ADCS). Using oversampling, the delta-sigma modulator spreads the quantization noise power across the oversampling frequency band, which is typically much greater than the input signal bandwidth. Additionally, the delta sigma modulator performs noise shaping by acting as a lowpass filter to the input signal and a highpass filter to the noise; most of the quantization noise power is thereby shifted out of the signal band.

The typical delta sigma modulator includes a summer summing the input signal with negative feedback, a linear filter, quantizer and a feedback loop coupling the quantizer output and the inverting input of the summer. In a first order modulator, the linear filter comprises a single integrator or other filter stage while the loop filter in a higher order modulator comprises a cascade of a corresponding number of filter stages. Higher-order modulators have improved quantization noise transfer characteristics over those of lower order, but stability becomes a more critical design factor as the order increases. The quantizer can be either a one-bit or a multiple-bit quantizer.

Switched-capacitor filters/integrators are useful in a number of applications including the integrator stages in delta sigma modulators. Generally, a basic differential switched-capacitor integrator samples the input signal onto sampling capacitors during the sampling (charging) phase. A reference voltage may also be sampled onto a reference sampling capacitor during this phase to implement a DAC function in the feedback loop of an ADC. During the following dump phase, the charge on the sampling capacitor is transferred to the summing node of an operational amplifier and an integrator capacitor in the amplifier feedback loop. The operational amplifier drives the integrator output.

One drawback with switched-capacitor filters, and similar circuits, such as current steering DACs operating in multiple phases, is inefficiency. In the case of a switched-capacitor integrator, the current drive capability of the operational amplifier is only exploited approximately half of the time for a two-phase design. In other words, while the operational amplifier does provide current drive during the dump phase, its current drive capability is generally not used during the sampling phase.

Addressing the problem of circuit inefficiency is major effort, especially in delta-sigma modulator applications. Among other things, an improvement in circuit efficiency can result in a tradeoff of other performance parameters, such as noise attenuation. Hence, some improved techniques are required for designing and constructing efficient multiple-phase filters and associated delta-sigma modulators that do not sacrifice noise performance or other operating characteristics.

SUMMARY OF INVENTION

The principles of the present invention are embodied in circuits and methods for performing delta-sigma modulation with multiple attenuation bands in the noise transfer function. According to one particular embodiment, a noise shaper is disclosed which includes a filter system for generating a first set of poles and zeros characterizing noise attenuation in a signal baseband of a noise transfer function and at least one additional set of at least one pole one and zero characterizing noise attenuation in at least one additional band outside the baseband of the noise transfer function.

Multiple attenuation bands in the delta-sigma modulator noise transfer function realize significant advantages. For example, a delta-sigma modulator with n number of attenuation bands defined on the unit circle in the z-plane will allow an output signal to be interleaved into n number of conversion elements. The noise attenuation in the multiple attenuation bands ensures that noise, which would otherwise be demodulated by mismatches between the interleaved conversion elements, is minimized. In the case of a switched-capacitor DAC or summer, interleaved conversion elements in turn allow the current capability of the output operational amplifier to be fully exploited in n number of non-overlapping phases. In a current steering circuit, such as a current steering DAC, interleaved current steering elements provide for the generation of a smoother output signal.

BRIEF DESCRIPTION OF DRAWINGS

For a more complete understanding of the present invention, and the advantages thereof, reference is now made to the following descriptions taken in conjunction with the accompanying drawings, in which:

FIGS. 3B–3D are gain versus frequency plots of the noise transfer function of the modulator of FIG. 3A for an exemplary set of feedforward coefficients;

DETAILED DESCRIPTION OF THE INVENTION

The principles of the present invention and their advantages are best understood by referring to the illustrated embodiment depicted in FIGS. 1–8 of the drawings, in which like numbers designate like parts.

Figure 1:
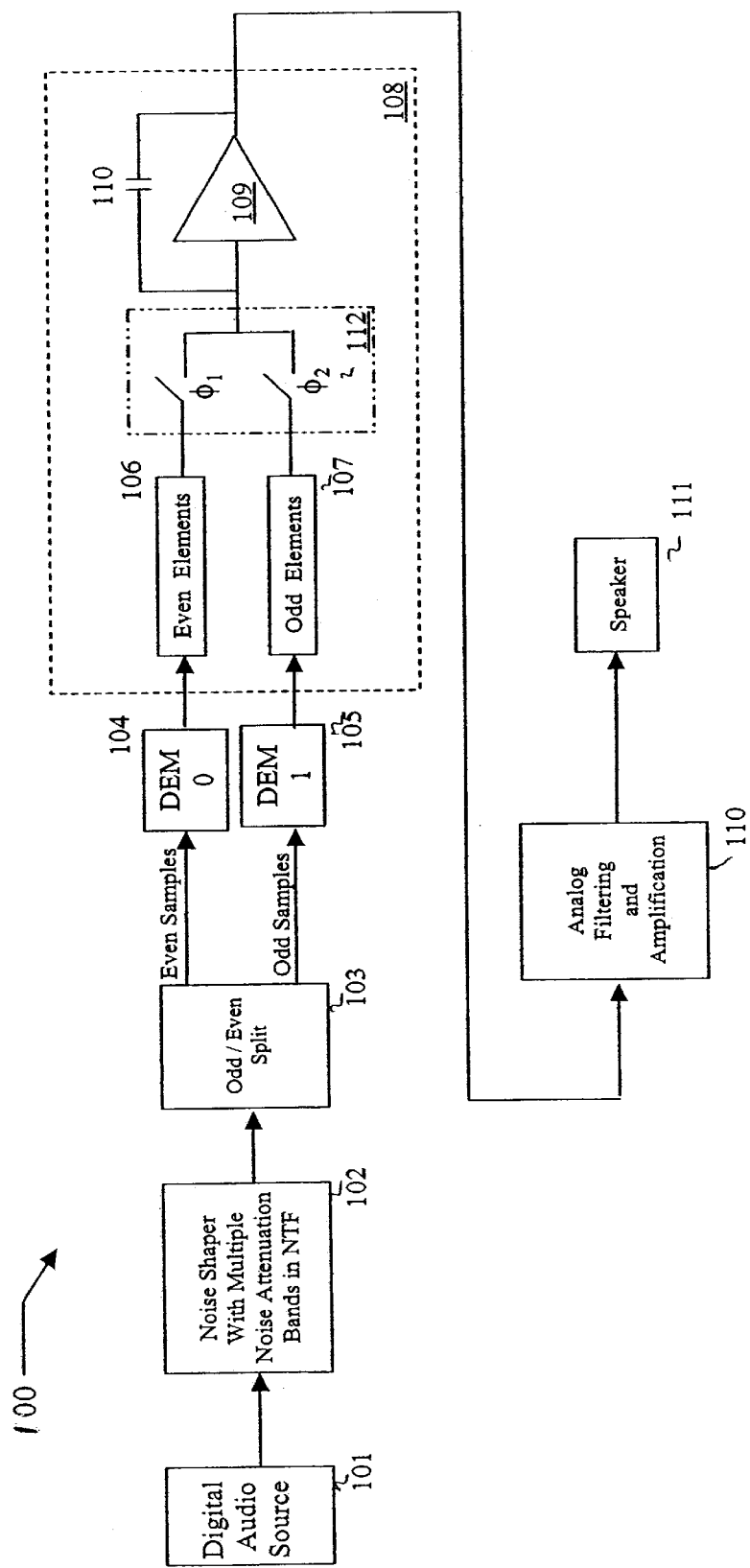
FIG. 1 is a high level functional block diagram of an exemplary digital to analog converter utilizing a delta-sigma modulator with multiple attenuation bands and interleaved conversion elements according to the inventive principles.

FIG. 1 is a high-level functional block diagram of a digital to analog converter system 100 suitable for demonstrating the principles of the present invention. For purposes of discussion, an audio application is described operating on digital audio from a source 101 such as a compact disk (CD) or digital versatile disk (DVD) player. Notwithstanding, the concepts described below can be utilized in a wide range of digital to analog, as well as analog to digital, applications.

System 100 is based on a multiple-bit noise shaper 102 with multiple attenuation bands in the noise transfer function (NTF). Noise shaper 102 will be discussed in detail further below; however, generally the NTF includes one attenuation band for attenuating noise in the signal passband and a second attenuation band for attenuating element mismatch noise demodulated by the subsequent splitting of the noise shaper output stream into odd and even samples.

The split into odd and even samples is performed in block 103 which switches the even samples into first dynamic element matching block (DEM 0) 104 and the odd samples into second dynamic element matching block (DEM 1) 105. The outputs from DEM blocks 104 and 105 are respectively passed to even elements 106 and odd elements 107 of DAC 108. DEM blocks 104 and 105 generally reduce mismatch noise by distributing the split output streams from noise shaper 102 between the individual elements of even and odd element blocks 106 and 107. Two exemplary structures for DAC 108 are described below. Generally, DAC 108 may be either of a switched-capacitor design or a current steering design. In the case of a switched-capacitor design, even and odd elements 106 and 107 will generally comprise switches and sampling capacitors. For a current steering design, even and odd elements 106 and 107 will generally comprise sets of weighted current sources.

Conceptually, during phase Phi 1, switching circuitry shown generally at 112 in FIG. 1 switches charge or current from even elements 106 to the summing nodes of an output stage 109, represented in FIG. 1 by a single-ended integrator. At the same time, the inputs to odd elements 107 are sampling the output from DEM 105. During phase Phi 2, the operations are reversed, with even elements 106 sampling the outputs from DEM 104 and odd elements 107 dumping charge or current to the summing nodes at the inputs of output stage 109.

Often, circuits operating in multiple phases, such as switched-capacitor circuits, are not exploited to their full capability. Consider a conventional differential switched-capacitor DAC. During the sampling phase, the differential signals at the DAC inputs are sampled onto a set of sampling capacitors. The charges on the sampling capacitors are then transferred to the differential summing nodes of an operational amplifier integrator during the integration (dump) phase. The operational amplifier provides the current drive to the next circuit block in the system. At the start of the next sampling phase, the summing nodes are decoupled from the sampling capacitors and the process repeats for the next sample. Consequently, while the operational amplifier is active, it is only effectively providing current drive fifty-percent of the time, namely in the integration phase.

It would be desirable to alternate sets of DAC elements or some other technique to fully exploit the current drive capability of the DAC opamps during all operating phases and thereby increase overall system efficiency. For example, one possible technique for increasing efficiency of circuit usage is to independently sample and integrate odd and even samples in alternate phases. In this case, the current drive of the DAC operational amplifier would be utilized almost all of the time. However, the use of alternating DAC elements, normally presents another set of problems.

In one possible approach, the incoming digital data stream could be modulated in a single delta-sigma modulator and the modulated data split into odd and even samples. The odd and even samples would then be respectively passed through corresponding odd and even sets of DAC elements, and the resulting odd and even analog signals summed in alternating phases in the DAC opamps. The use of a single delta-sigma modulator has the advantage of achieving good global noise shaping; however, any mismatch between the two separate sets of DAC elements operating on alternating sample streams will demodulate the modulator output noise at the Nyquist frequency (Fs/2). This mismatch-demodulated noise can fold back into the signal baseband.

A second approach is to use two independent delta-sigma modulators for the odd and even data streams and independent DAC elements at the output of each modulator. This technique reduces the problem of potential mismatch demodulated noise between the DAC elements; however, since each delta-sigma modulator is operating on data at half the sampling rate, the global noise shaping function of each NTF is adversely impacted. (Generally, by halving the sample rate through each modulator, the potential noise attenuation in the corresponding signal band is approximately halved.)

Figure 2A:
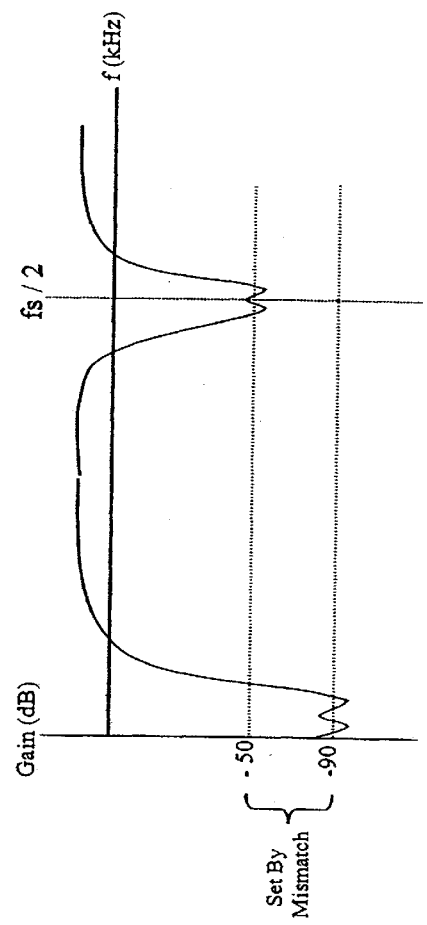
FIG. 2A is a gain versus frequency plot of the noise transfer function (NTF) of an exemplary delta-sigma modulator with two noise attenuation bands.

In the system of FIG. 1, the NTF of noise shaper 102 has at least two noise attenuation bands as shown in FIG. 2A. This configuration advantageously balances the two approaches discussed above. The low frequency attenuation band attenuates the noise in the signal band and the second band attenuates noise which could be demodulated at the Nyquist rate Fs/2 by splitting (alternating) data streams into separate sets of DAC element 106 and 107 with non-zero mismatch (imperfect matching). In particular, the difference between the average level of attenuation in the signal band and the average level attenuation at Nyquist is a function of the mismatch between even and odd elements 106 and 107 after dynamic element matching. If more mismatch exits, then more modulator noise at Nyquist will be demodulated and therefore more attenuation in the NTF at Nyquist will be required. An increase in attenuation at Nyquist will result in a decrease in attenuation in the signal band. (Generally, the area below the x-axis of FIG. 2A must equal the area above the x-axis.) Thus, a balancing must be made between the global noise shaping of the NTF and local attenuation levels. For a one-percent mismatch, a difference in attenuation levels in the signal band and at Nyquist of approximately 40 dB is optimal.

Figure 2B:
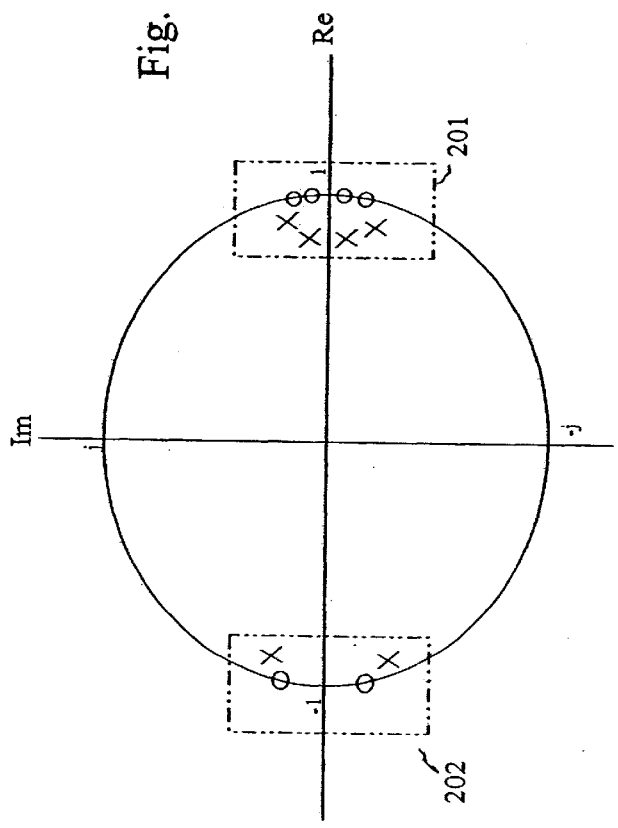
FIG. 2B is a plot in the z-plane of the poles and zeros of delta-sigma modulator with multiple NTF noise attenuation bands similar to those shown in FIG. 2A.

To produce an NTF in noise shaper 102 with a given difference between the average attenuation level in the signal band and the average attenuation at Nyquist, a configuration should be selected with two unequal sets of poles in the left and right halves of the z-plane. A z-plane plot of the pole and zeros characterizing one such noise shaper is shown in FIG. 2B. In this example, a 6$^{th}$ order noise shaper is characterized which includes a first set of pole-zero pairs 201 that define the shape of the low frequency (signal band) noise attenuation of the NTF. A second set of poles 202 defines the shape of the noise attenuation band at Nyquist. The number of poles and zeros can vary between embodiments, so long as the number of pole-zero pairs around the Nyquist frequency (Re=−1, Im=0) is less than the number of pole-zero pairs around the DC point (Re=1, Im=0). In other words, the two sets of pole-zero pairs 201 and 202 are not mirror images. Moreover, a number of different pole-zero placements are possible depending on the desired global and local noise shaping functions. For example, an alternate asymmetrical zero-pole placement would be a single zero at z=−1 and an associated pole on the negative real axis within the unit circuit and two or more zeros on the unit circuit about the DC point and an associated poles within the unit circle.

Figure 3A:
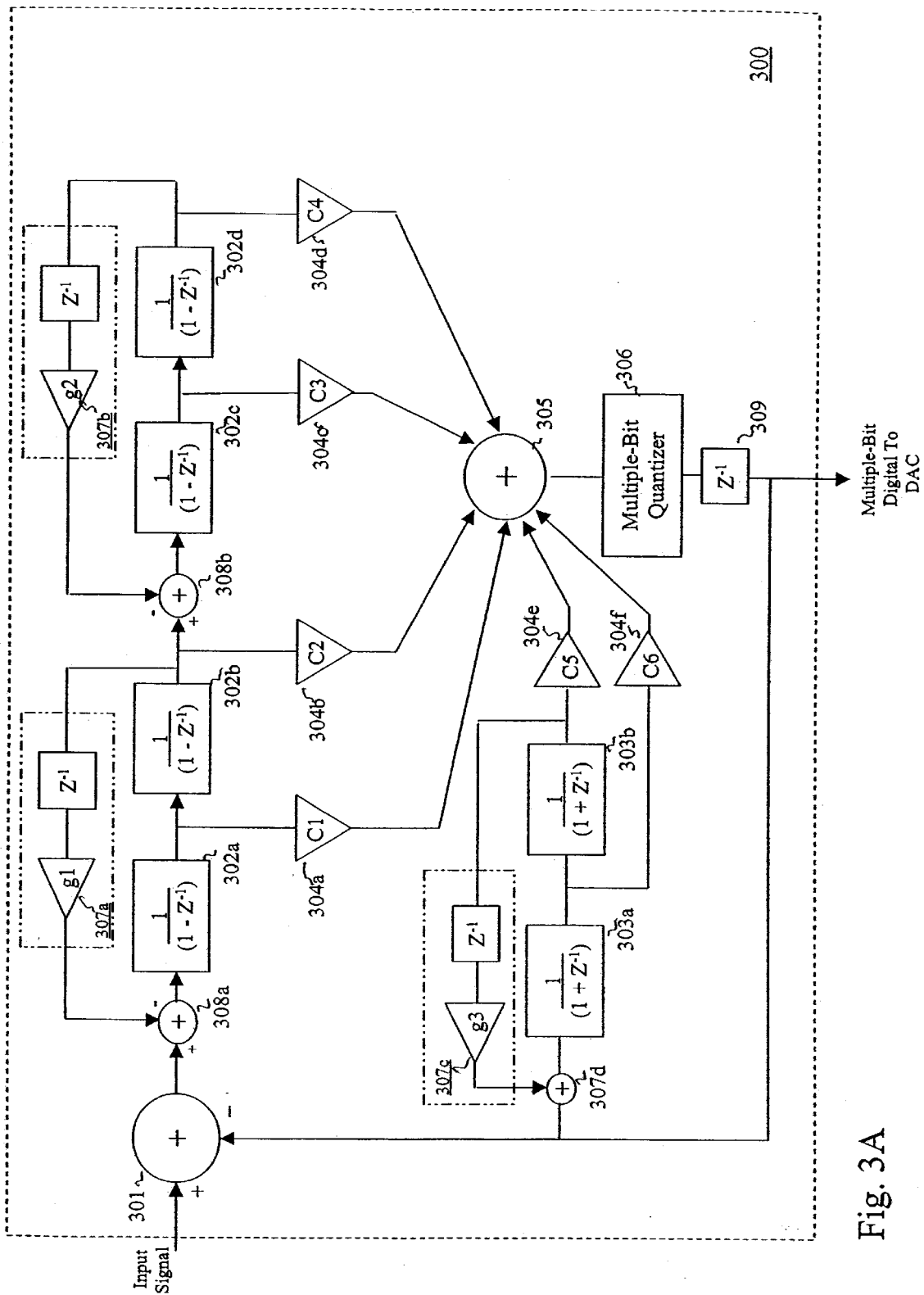
FIG. 3A is a functional block diagram of a feedforward delta-sigma modulator suitable for producing the pole-zero locations shown in FIG. 2B.
Figure 4:
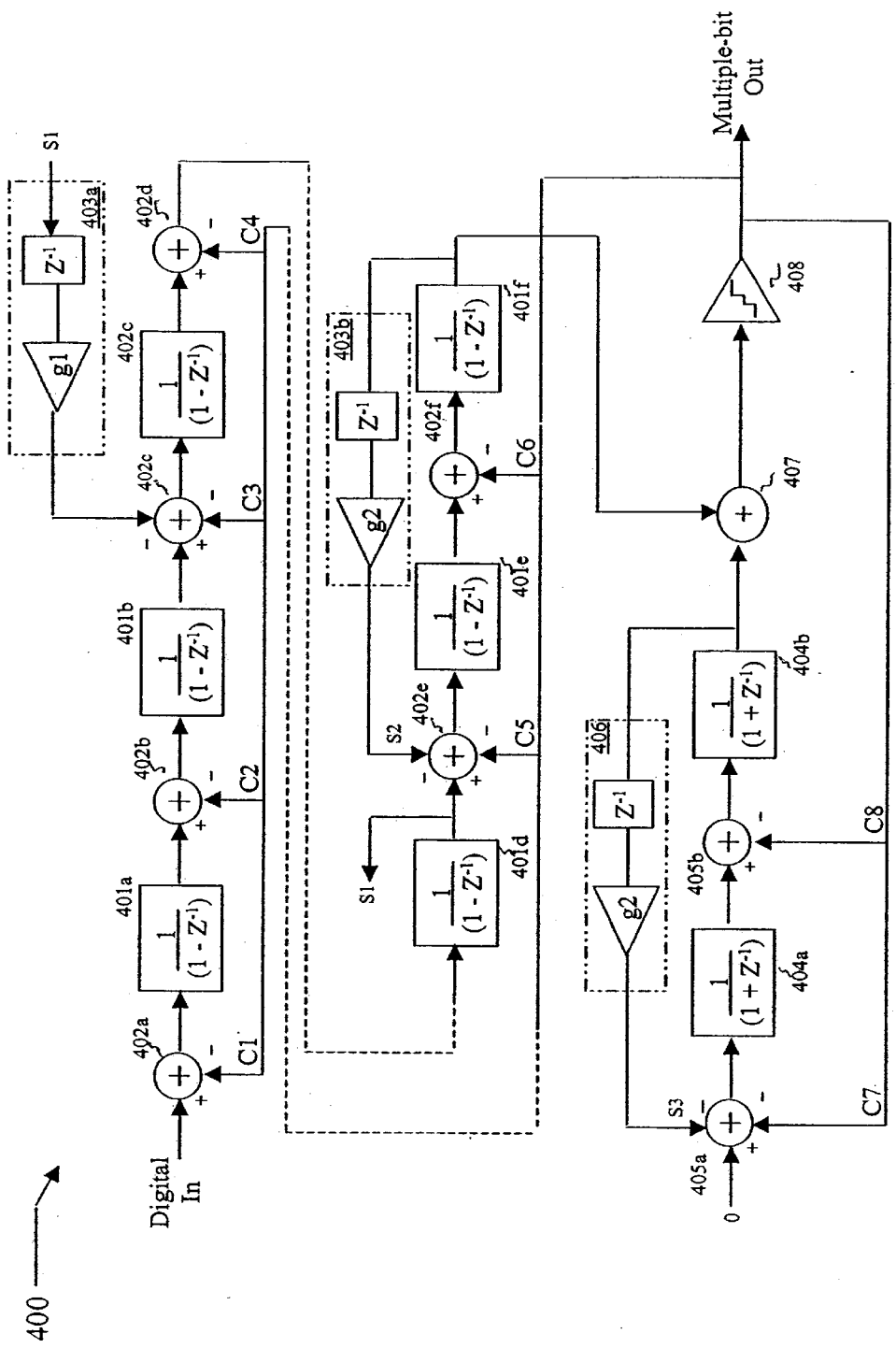
FIG. 4A is a functional block diagram of a feedback delta-sigma modulator producing asymmetrical sets of pole-zero pairs in the left and right halves of the z-plane.
FIGS. 4B–4D are gain versus frequency plots of the noise transfer function of the modulator of FIG. 4A for an exemplary set of coefficients.

FIG. 3A is an exemplary 6th order weighted-feedforward delta-sigma modulator 300 which will produce the zero-pole locations of FIG. 2B and the corresponding NTF of FIG. 2A. Modulator 300 generally includes an input summer 301 and a loop filter having four (4) filter stages 302a–302d each with a response of $1/(1-Z^{-1})$ and two (2) filter stages 303a and 303b each with a response of $1/(1+Z^{-1})$. The feedforward coefficients Cx are implemented by feedforward stages 304a–304d, which could be attenuators, amplifiers (gain stages) or multipliers in digital embodiments, driving an output summer 305 from the outputs of filter stages 302a–302d and 303a–303b. The output from modulator 300 is generated by a multiple-bit quantizer 306 and a delay element 309 which is also fed-back to the inverting input of input summer 301. The illustrated embodiment also includes three feedback loops 307a–307c and their respective summers 308a–308c. A general discussion of delta-sigma modulator topologies, including feedforward designs, can be found in publications such as, in Norsworthy et al., *Delta-Sigma Data Converters, Theory, Design and Simulation*, IEEE Press, 1996). (For analog applications, such as A/D converters, the digital filter stages and related circuits discussed below will essentially be replaced with their analog equivalents, also described in the publications.)

Filter stages 302a–302d, each having transfer functions of $1(1-Z^{-1})$, produce the poles and zeros 201 in the right half of the z-plane defined by the positive real axis of FIG. 2B. The actual locations of the poles are set by feedforward coefficients C1–C4. Feedback loops 307a and 307b move the associated zeros along the unit circle (z=1) from the DC point (Re=1, Im=0). Similarly, filter stages 303a and 303b, each having transfer functions of $1/(1+Z^{-1})$, and feedforward coefficients C5 and C6, place the poles 202 in the left hand half of the z-plane of FIG. 2B defined by the negative real axis. Feedback loop 307c moves the associated zeros from the Nyquist point (RE=−1, Im=0) along the unit circle.

Table 1 gives an exemplary set of coefficients for a typical audio application operating on data with a common input sampling rate of 48 kHz using the topology of FIG. 3A. The data are upsampled by a factor of 128 such that the Nyquist frequency fs/2 is approximately 3.07 MHz. The resulting noise transfer function is shown in FIG. 3B, with FIG. 3C being an expanded view of the noise attenuation in the signal band of the NTF and FIG. 3D being an expanded view of the noise attenuation at Nyquist. As shown in FIGS. 3B–3C, the desired two bands of attenuation are produced which will allow splitting of the data from quantizer 300 into odd and even streams into output DAC 108.

TABLE 1

| Coefficient | Value for 48 kHz, 128x oversampled audio |
|---|---|
| $C_1$ | 0.472636 |
| $C_2$ | 0.213727 |
| $C_3$ | 0.0451561 |
| $C_4$ | 0.00529628 |
| $C_5$ | 0.249534 |
| $C_6$ | 0.0537832 |

An exemplary 8$^{th}$ order feedback delta-sigma modulator 400 which will produce asymmetrical pole-zero sets in the right and left halves of the z-plane is shown in FIG. 4A. Here, six filter stages 401a–401f each with transfer functions $1/(1-Z^{-1})$ and feedback summers 402a–402f with respective feedback coefficients C1–C6 will generate 6 pole-zero pairs in the right half-plane defined by the positive real axis. Two feedback loops 403a and 403b move four of the zeros from the DC (Re=1, Im=0) point along the unit circle. Two pole-zero pairs are defined in the left half of the z-plane by filter stages 404a and 404b each having transfer functions $1/(1+Z^{-1})$ and feedback summers 405a–405b with respective feedback coefficients C7 and C8. Feedback loop 406 shifts the two zeros away from the Nyquist point Re=−1, Im=0.

The outputs from the filter chains respectively formed by filter stages 401a–401f and 404a–404b are summed by output summer 407. Quantizer 408 generates the multiple-bit modulator output in this embodiment. The coefficients for an exemplary 48 kHz audio sample stream upsampled by a factor of 128 and the feedback topology of FIG. 4A are provided in Table 2.

TABLE 2

| Coefficient | Value for 48 kHz, 128x upsampled audio |
|---|---|
| $C_1$ | 1.79268 × 10$^{-6}$ |
| $C_2$ | 0.0000567507 |
| $C_3$ | 0.000912029 |
| $C_4$ | 0.00898768 |
| $C_5$ | 0.0646919 |
| $C_6$ | 0.262072 |
| $C_7$ | 0.187477 |
| $C_8$ | 0.46439 |

FIGS. 4B–4C respectively show the resulting NTF and expanded views of the noise attenuation in the signal and Nyquist bands.

Figure 5A:
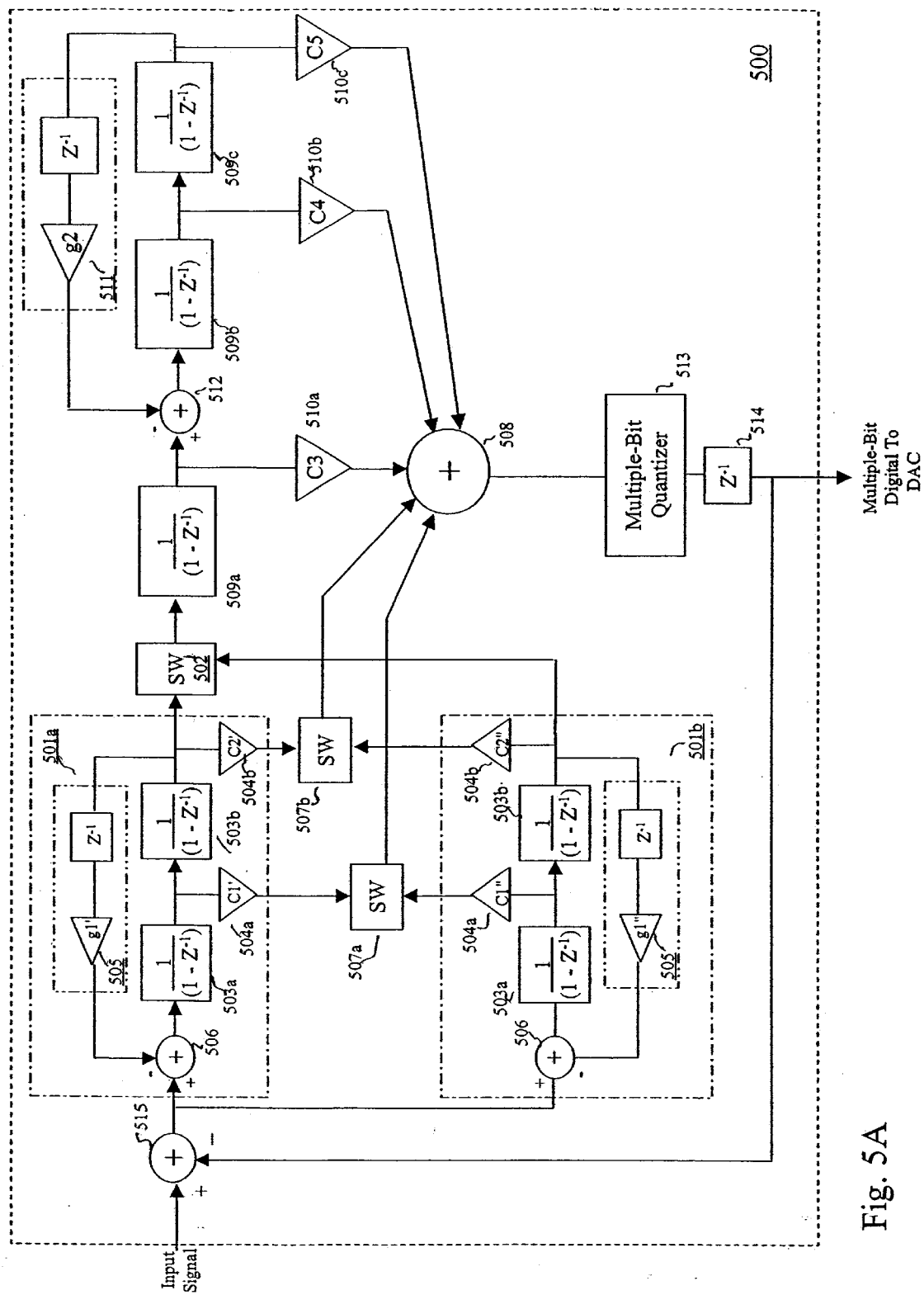
FIG. 5A is a functional block diagram of a delta-sigma modulator with interleave filter stages suitable for generating an NTF with multiple noise attenuation bands.

A third alternative for generating an NTF with multiple attenuation bands is a delta sigma modulator with interleaved loop filter stages. One example is the weighted feedforward modulator 500 shown in FIG. 5A. In this case, the local noise shaping at Nyquist is characterized by a pair of sets of independent loop filter stages 501a and 501b interleaved in time by a switch ("SW") or similar circuit 502. Each set of independent filter stages 501a and 501b is represented in FIG. 5A by a pair of filter stages 503a and 503b, corresponding feedforward stages 504a and 504b with coefficients $C_1$, and $C_2$ for setting the local poles, and a feedback loop 505 (with one delay $Z^{-1}$ and gain g$^1$) and summer 506 for setting the local zeros. (The structure of each set of 501a and 501b may vary from a single filter stage 503 to three or more filter stages 503 and include more than one feedback loop, depending on the desired number and location of the local poles and zeros). The outputs from gain stages 504 of independent loop filter stage sets 501a and 501b are interleaved by a corresponding set of switches 507a and 507b into the modulator output summer 508.

The global (baseband) noise shaping is characterized by a set of shared loop filter stages, in this case three integrator stages 509a–509c and associated feedforward stages 510a–510c with respective coefficients $C_3$–$C_5$ into output summer 508. The outputs of stages 501a and 501b are fed into a switch ("SW") 502. The output of SW 502 is, in turn, fed into the first integrator stage 509a. The number of global filter stages may also vary from embodiment to embodiment depending on the desired number and locations of the global pole-zero pairs in the NTF. A feedback loop 511 (during a gain of g1 and a delay $Z^{-1}$) and summer 512 are shown for moving the global noise shaping zeros on the unit circuit away from the DC point (Re=1, Im=0).

A multiple-bit quantizer 513 and a delay element 514 preferably generate the output of modulator 500. The resulting output signal is fed-back to the inverting input of the modulator input summer 514.

Figure 5B:
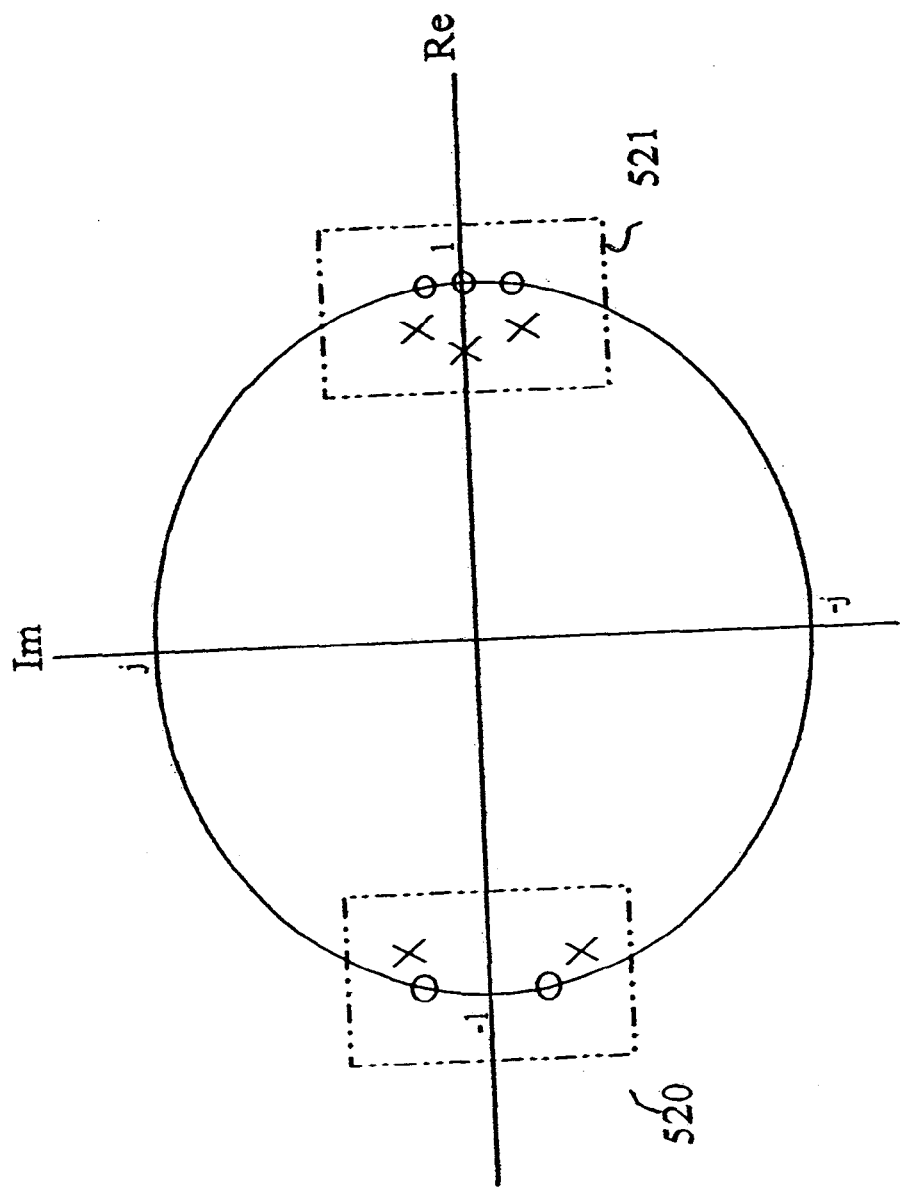
FIG. 5B is a pole-zero plot in z-plane illustrating the operation of the modulator of FIG. 5A.

By interleaving between independent sets of filter stages 501, each set 501a or 501b is contributing to the input of summer 508 at half the sampling rate. Consequently, the poles and zeros set by filter sets 501a and 501b are translated into the left half-plane around the Nyquist (fs/2) point Re=−1, Im=0, as generally shown in FIG. 5B at 520. As with the exemplary embodiments already described, preferably the number of poles and zeros in the right hand half-plane is greater than those in the right hand half-plane. In this example, filter sets 501a and 501b produce two pole-zero pairs around Nyquist and global (shared) filter stages 509a–509c produce three pole-zero pairs 521 about the DC point.

Figure 6:
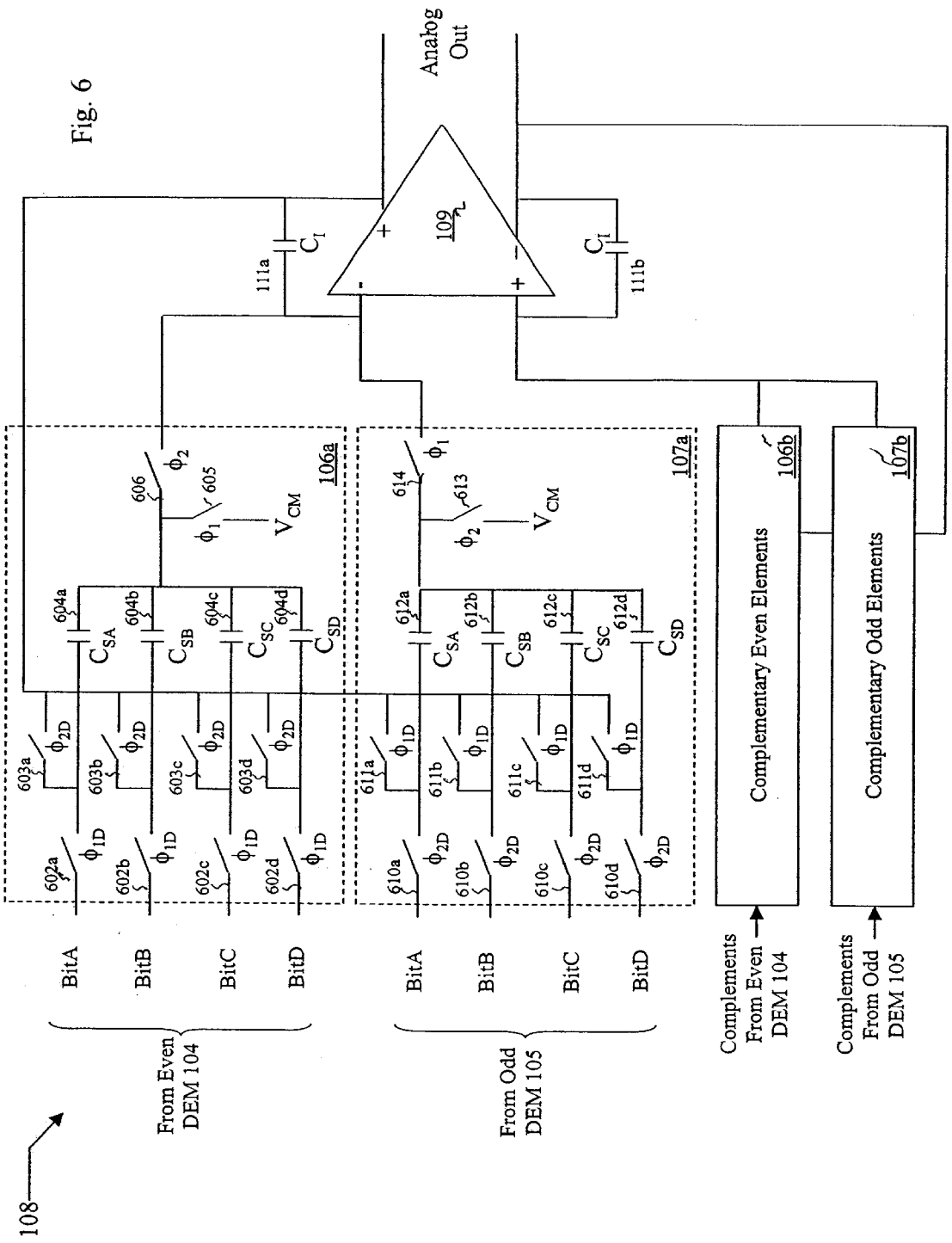
FIG. 6 is an electrical schematic diagram of an exemplary DAC with interleaved conversion elements suitable for use in the system of FIG. 1.

FIG. 6 is an electrical schematic diagram of one embodiment of DAC 108. In this case, a fully differential design is shown. For clarity, a 4-bit DAC operating on 4-bit quantized samples from the DEMs is shown for illustrative purposes, although the quantized sample width will vary from application to application depending on the quantizer used. Generally, while even elements 106a and 106b are sampling charge, odd elements 107a and 107b are dumping charge to opamp 109 and vice-versa. Consequently, the current drive capability of opamp 109 is maximized.

In this embodiment, the even samples and their complements (in the differential case) are sent to respective even elements 106a and 106b at the inverting and non-inverting summing nodes of operational amplifier 109, respectively. Even elements 106a for the inverting summing node are shown in further detail, although complementary elements 106b preferably have the same structure. The even elements of blocks 106a and 106b sample charge during Phase 1 ($\phi_1$) and dump charge during Phase 2 ($\phi_2$). Specifically, switches 605 close at the start of Phase 1 and after a delay (Phase 1 delayed—$\phi_{1D}$), input switches 602a–602d close to sample the corresponding input bits BitA–BitD from even DEM 104 on to the respective input plates of even sampling capacitors 604a–604d. Switches 603a–603d and 606 are open during Phase 1. During Phase 2 ($\phi_2$), switches 606 initially close and after a delay (Phase 2 delayed—$\phi_{2D}$), switches 603a–603d close to force the charge on the respective input plates of sampling capacitors 604a–604d to the corresponding summing node of opamp 109. During Phase 2, switches 602a–602d and 605 are open.

Similarly, the odd samples and their complements are sent to respective odd elements 107a and 107b at the inverting and non-inverting summing nodes of operational amplifier 108. Odd elements 107a for the inverting summing node are shown in further detail, although 107b preferably have the same structure. The odd elements of blocks 107a and 107b sample charge during Phase 2 ($\phi_2$) and dump charge during Phase 1 ($\phi_1$). Specifically, switches 613 close initially during Phase 2 and after a delay (Phase 2 delayed—$\phi_{2D}$), input switches 610a–610d close to sample the corresponding input bits BitA–BitD from odd DEM 105 on to the respective input plates of odd sampling capacitors 612a–612d. Switches 611a–611d and 614 are open during Phase 2. During Phase 1 ($\phi_1$), switches 614 initially close and after a delay (Phase 1 delayed—$\phi_{1D}$), switches 611a–611d close to force the charge on the respective input plates of sampling capacitors 612a–612d. During Phase 1, switches 610a–610d and 613 are open.

Figure 7:
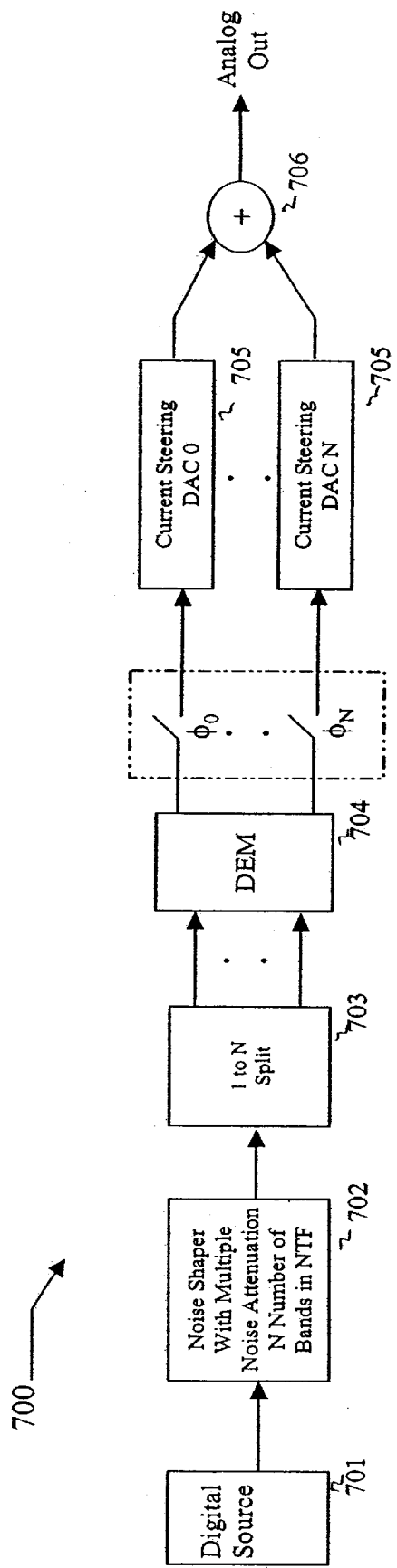
FIG. 7 is a functional block diagram of a generalized DAC operating in N number of phases in N sets of interleaved conversion elements.

The principles described above can be extended to instances where more than two attenuation bands in an NTF of a delta-sigma modulator are required. For example, FIG. 7 illustrates a generalized digital to analog system 700 which operates on N number of phases with N number of DAC elements. System 700 includes a digital data source 701 and a noise shaper 702 generating N number of attenuation bands in its NTF. Noise shaper 702 will be discussed further below.

A splitter 703 partitions the quantized digital data stream from noise shaper 702 into N number of sample streams. DEM 704 then routes the sample streams to N number of switches or similar circuits 704 operating in N number of overlapping phases ($\phi_N$). In this embodiment, N number of current-steering DACs 705 convert the sample streams into analog currents which are then summed by summer 706 to produce the final analog output signal.

One advantage of using multiple phases in system 700 is the result of increased smoothness in the analog output signal. Generally, if more phases and current steering DACs exist, then the analog output signal will be smoother. When the input stream is split N times, the mismatch will demodulate the noise from noise shaper 702 into N separate bands. Hence, noise shaper 702 is preferably designed to produce N corresponding noise attenuation bands.

Figure 8B:
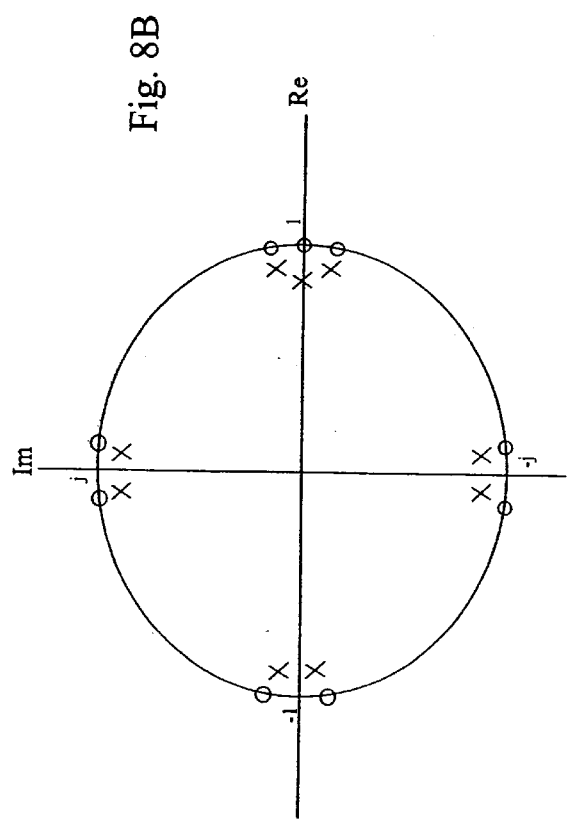
FIG. 8B is a pole-zero plot in the z-plane characterizing one possible set of poles and zeros suitable for achieving the NTF of FIG. 8A.
Figure 8A:
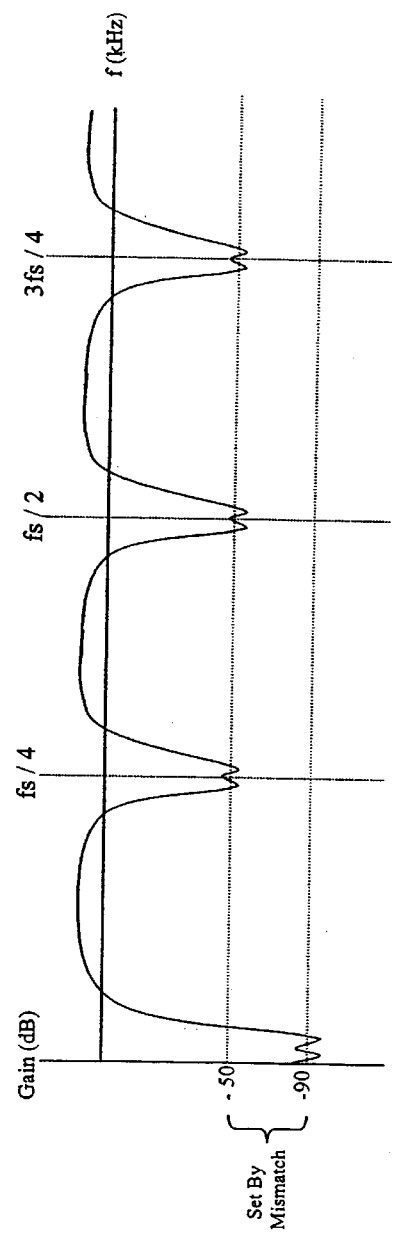
FIG. 8A is a gain versus frequency plot of the NTF of an exemplary delta-sigma modulator with four (4) noise attenuation bands.

For example, if N=4 and output from noise shaper 702 is split into four (4) sample streams each at fs/4, then any mismatch between DAC elements 705 will demodulate into the bands fs/4, fs/2 and 3fs/4. Noise shaper 702 therefore should have four corresponding attenuation bands as shown in FIG. 8A. One possible pole-zero plot that corresponds to these attenuation bands is shown in FIG. 8B. The pole-zero placement in FIG. 8B, in one embodiment, is achieved by using the modulator topology of FIG. 5A modified with four (4) independent filter stages 501a to 501d having outputs four-times interleaved into shared filter stages 503a to 503d. Alternatively, a feedforward or feedback topology having a pair of filter stages with a transfer function of $1/(1-Z^{-4})$ and associated feedback loops, which place poles and zeros about Z=1, −1, j and −j, is also utilized.

In sum, a modulator with multiple noise attenuation bands in the NTF allows the bit stream at the inputs of a DAC, summer, or similar circuit operating in multiple phases, to be split into at least two separate streams. Specifically, the modulator noise potentially demodulated by the switching bit streams between elements with finite mismatch, as well as noise in the signal band, are attenuated in corresponding attenuation bands in the modulator NTF. In turn, the resulting multiple bit streams are converted in separate operating phases to maximize use of conversion circuit elements.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A noise shaper comprising a quantizer generating quantization noise and a filter system, the quantizer and the filter system responding to each other in a loop to generate a noise transfer function with first and second attenuation bands attenuating the quantization noise in a noise shaper output.

2. The noise shaper of claim 1 wherein the first and second attenuation bands include an attenuation band in a signal baseband of the noise transfer function and another attenuation band outside of the signal baseband of the noise transfer function.

3. The noise shaper of claim 1 wherein first and second attenuation bands correspond to first and second sets of poles and zeros of the filter system.

4. The noise shaper of claim 3 wherein the first and second sets of poles and zeros comprise first and second sets of poles and zeros spatially separated in a z-plane characterization of the noise transfer function.

5. The noise shaper of claim 3 wherein the first and second sets of poles and zeros differ in number of poles and zeros in a z-plane characterization of the noise transfer function.

6. The noise shaper of claim 3 wherein the filter system comprises n number of interleaved filters for generating n number of sets of poles and zeros, where n is an integer greater than 1.

7. The noise shaper of claim 1 comprising a feed-forward delta-sigma modulator wherein the filter system comprises:
a filter having a first transfer function for characterizing the first attenuation band and receiving a modulator input signal and outputting a first signal for weighted input into a modulator summer and a modulator quantizer at an output of the summer; and
a filter having a second transfer function for characterizing the second attenuation band and receiving an input signal from an output of the quantizer and outputting a second signal for weighted input into the modulator summer and quantizer.

8. The noise shaper of claim 1 comprising a feed-back delta-sigma modulator wherein:
a filter having a first transfer function for characterizing the first attenuation band and receiving an input signal to the modulator and feed-back from a modulator quantizer and outputting a signal to a modulator summer at an input to the quantizer; and
a filter having a second transfer function for characterizing the second attenuation band and receiving feedback from the quantizer and outputting a signal to the summer.

9. The noise shaper of claim 1 wherein the filter system comprises a digital filter system.

10. The noise shaper of claim 1 wherein the filter system comprises an analog filter system.

11. The noise shaper of claim 1 wherein the first attenuation band includes DC and the second attenuation band includes the frequency Fs/n, wherein Fs is the sampling frequency and n is an integer greater than one.

12. The noise shaper of claim 1 wherein the first and second attenuation bands are selected first and second attenuation bands of a plurality of at least two attenuation bands, a sleeted one of the plurality of attenuation bands including DC and other ones of the plurality of attenuation bands including frequencies of Fs/n·m, wherein Fs is the sampling frequency and m and n are integers, with n greater than one and m less than n.

13. A method of modulating a signal in a delta sigma modulator comprising:
setting a first set of at least one pole-zero pair defining noise attenuation in a first band of a noise transfer function of the modulator; and
setting a second set of at least one pole-zero pair defining noise attenuation in at least one second band in the noise transfer function of the modulator, the first and second numbers of pole-zero pairs selected to produce a difference in noise attenuation between the first and second bands in the noise transfer function.

14. The method of claim 13 wherein said steps of setting the first and second sets of at least one pole-zero pair comprise the steps of setting first and second sets of at least one pole-zero pair rotated with respect to each other about the origin of a z-plane characterization of the noise transfer function of the modulator.

15. The method of claim 13 wherein said steps of setting the first and second sets of at least one pole-zero pair comprise the steps of setting first and second sets of unequal numbers of pole-zero pairs.

16. The method of claim 13 wherein said steps of setting the first and sets of at least one pole-zero pair comprise the steps of placing the pole-zero pairs about the DC and Nyquist points of a z-plane characterization of the noise transfer function of the modulator.

17. The method of claim 13 wherein said steps of setting first number of pole-zero pairs comprise the steps of placing about the DC point on a unit circle of a z-plane characterization of the noise transfer function of the delta sigma modulator and the second number of pole-zero pairs comprises n number of sets of pole-zero pairs placed at points about the unit circle in the z-plane characterization of the noise transfer function of the delta sigma modulator spaced from the first number of pole-zero pairs to define n number of attenuation bands in the noise transfer function.

18. The method of claim 13 wherein said step of setting the second set of at least one pole-zero pair comprises the substep of interleaving first and second filter stages.

19. The method of claim 13 further comprising the step of selecting a modulator topology of a selected number of filter stages wherein:
said step of setting the first set of at least one pole-zero pair comprises the substep of selecting at least one filter stage having a first transfer function; and
said step of setting the second set of at least one pole-zero pair comprises the substep of selecting at least one filter stage having a second transfer function.

20. The method of claim 13 wherein the modulator comprises a digital delta-sigma modulator.

21. The method claim 13 wherein the modulator comprises an analog delta-sigma modulator.

22. A data converter comprising:

a delta-sigma modulator having a noise transfer function with a plurality of noise attenuation bands including a first noise attenuation band for attenuating noise in a converter output signal baseband and at least one second noise attenuation band;

circuitry for splitting the output signal from the modulator into a plurality of intermediate signals;

a plurality of interleaved data conversion elements each for converting a corresponding one of the intermediate signals from a first form to a second form; and a summer for summing output signals from the conversion elements into the converter output signal, the second noise attenuation band of the modulator characterized to attenuate noise output from the modulator and demodulated by mismatch between the interleaved conversion elements.

23. The data converter of claim 22 wherein the circuitry for splitting splits the output signal into n number of intermediate signals for conversion by n number of interleaved conversion elements and the at least one second noise attenuation band comprises n number of attenuation bands in the noise transfer function of the modulator.

24. The data converter of claim 22 wherein the interleaved data conversion elements comprise a plurality of switched-capacitor elements operating in interleaved operating phases.

25. The data converter of claim 22 wherein the interleaved data conversion elements comprise a plurality of current steering elements operating in interleaved operating phases.

26. The data converter of claim 22 wherein the first form is digital and the second form is analog.

27. The data converter of claim 22 wherein the first form is analog and the second form is analog.

28. The data converter of claim 22 wherein a difference in noise attenuation levels between the first noise attenuation band and the at least one second noise attenuation bands is selected as a function of a degree of the mismatch between the interleaved conversion elements.

29. The data converter of claim 22 wherein the delta-sigma modulator produces at least two sets of pole-zero pairs, each set differing in number and location of the pole-zero pairs on the z-plane.

* * * * *